United States Patent [19]
Werner et al.

[11] Patent Number: 5,966,042
[45] Date of Patent: Oct. 12, 1999

[54] CURRENT STEERING OUTPUT CIRCUIT WITH SWITCHABLE SHUNT RESISTOR

[75] Inventors: Wayne E. Werner, Coopersburg, Pa.; Thaddeus John Gabara, Murray Hill, N.J.; Bijit Thakorbhai Patel, Breinigsville, Pa.

[73] Assignee: Lucent Technologies Inc., Murray Hill, N.J.

[21] Appl. No.: 08/939,534

[22] Filed: Sep. 29, 1997

[51] Int. Cl.⁶ .......................... H03K 17/16; H03K 17/04
[52] U.S. Cl. ..................... 327/424; 327/108; 327/310; 327/374; 327/389; 326/17; 326/27; 326/83; 307/52
[58] Field of Search ...................... 327/423, 424, 327/108, 109, 374, 379, 382, 384, 389, 309, 310, 313, 327, 328; 326/17, 18, 26, 27, 56, 57, 58, 82, 83, 89; 363/17, 98, 132; 307/52, 53

[56] References Cited

U.S. PATENT DOCUMENTS

| | | |
|---|---|---|
| 4,308,466 | 12/1981 | Cushman et al. ................. 327/423 |
| 4,742,535 | 5/1988 | Hino et al. ................. 363/17 |
| 4,979,089 | 12/1990 | Takase et al. ................. 363/132 |
| 5,333,081 | 7/1994 | Mitsui ................. 327/110 |
| 5,808,884 | 9/1998 | Teggatz et al. ................. 363/98 |

*Primary Examiner*—Timothy P. Callahan
*Assistant Examiner*—Terry L. Englund

[57] ABSTRACT

A current output circuit comprises a current driver that is switchably connected across two output nodes by a switching assembly and having a switchable shunt resistor connected across the current driver. The switchable shunt resistor may be switched between a non-conducting state and a resistive conducting state. In a first data state, the current driver is connected to the output nodes by the switching assembly and the switchable shunt resistor is non-conducting so that the supplied current will flow through a load attached to the output nodes. In a second data state, the current driver is disconnected from the output nodes and the switchable shunt resistor is in a resistive conducting state. In this state the current bypasses the load and is diverted through the switchable shunt resistor. Several current drivers with appropriate switching arrangements and one or more switchable shunt resistors may be provided to allow for asymmetric current outputs in various data states.

26 Claims, 6 Drawing Sheets

CURRENT STEERING OUTPUT CIRCUIT WITH SWITCHABLE SHUNT RESISTOR

TECHNICAL FIELD

This invention relates to an asymmetrical current mode output circuit.

BACKGROUND OF THE INVENTION

A conventional asymmetrical data interface, such as that used in SCSI architecture, requires a base current to be always present on an active interface. An output buffer circuit connected to the interface must source current in different directions according to the output data state. In one data state, the current output by the driver is in the same direction as the base current. Thus, the net current on the interface is the output current augmented by the base current. In the other state, the current output by the driver opposes, and is thus diminished by, the base current.

Figure 1:
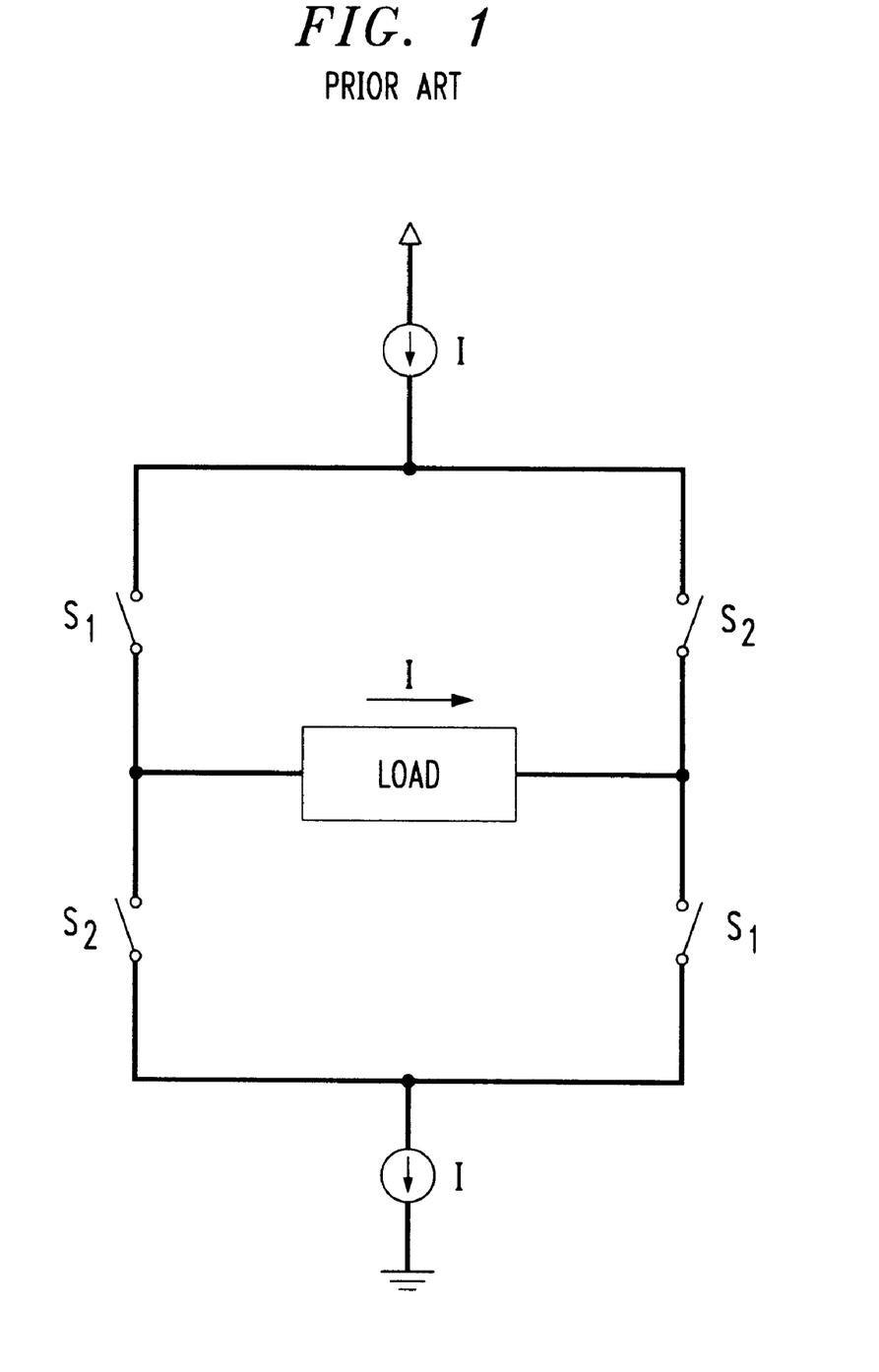
FIG. 1 is an ideal representation a conventional current steering output circuit.

A conventional current steering output buffer is illustrated in FIG. 1. The circuit contains a current driver (here consisting of a matched current source and sink) which is connected to the output nodes by a current switch. The output nodes are connected across a load which may have current flowing through it from other sources (not shown). In a first state, switches $S_1$ are closed, switches $S_2$ are open, and the current driver contributes a current I to the total load current. In a second state, switches $S_2$ are closed, switches $S_1$ are open, and the current driver contributes a current of −I to the total load current. In a third state, switches $S_1$ and $S_2$ are both open and the current driver contributes no current to the net load current.

Some applications require the output currents of the driver in the two data states to be asymmetrical with a ratio chosen to result in a net symmetrical current flow over the data bus. For example, an asymmetrical data bus may have a base load of −2 mA and the driver may provide output currents of +12 mA in state one and −8 mA in state two. In the first state, the net current flow is +12 mA−2 mA=+10 mA. In the second state, the net current flow is 8 mA−2 mA=−10 mA. Thus, the net result of driving asymmetrical currents into an asymmetrical load is a symmetrical current flow of +10 mA and −10 mA.

Figure 2:
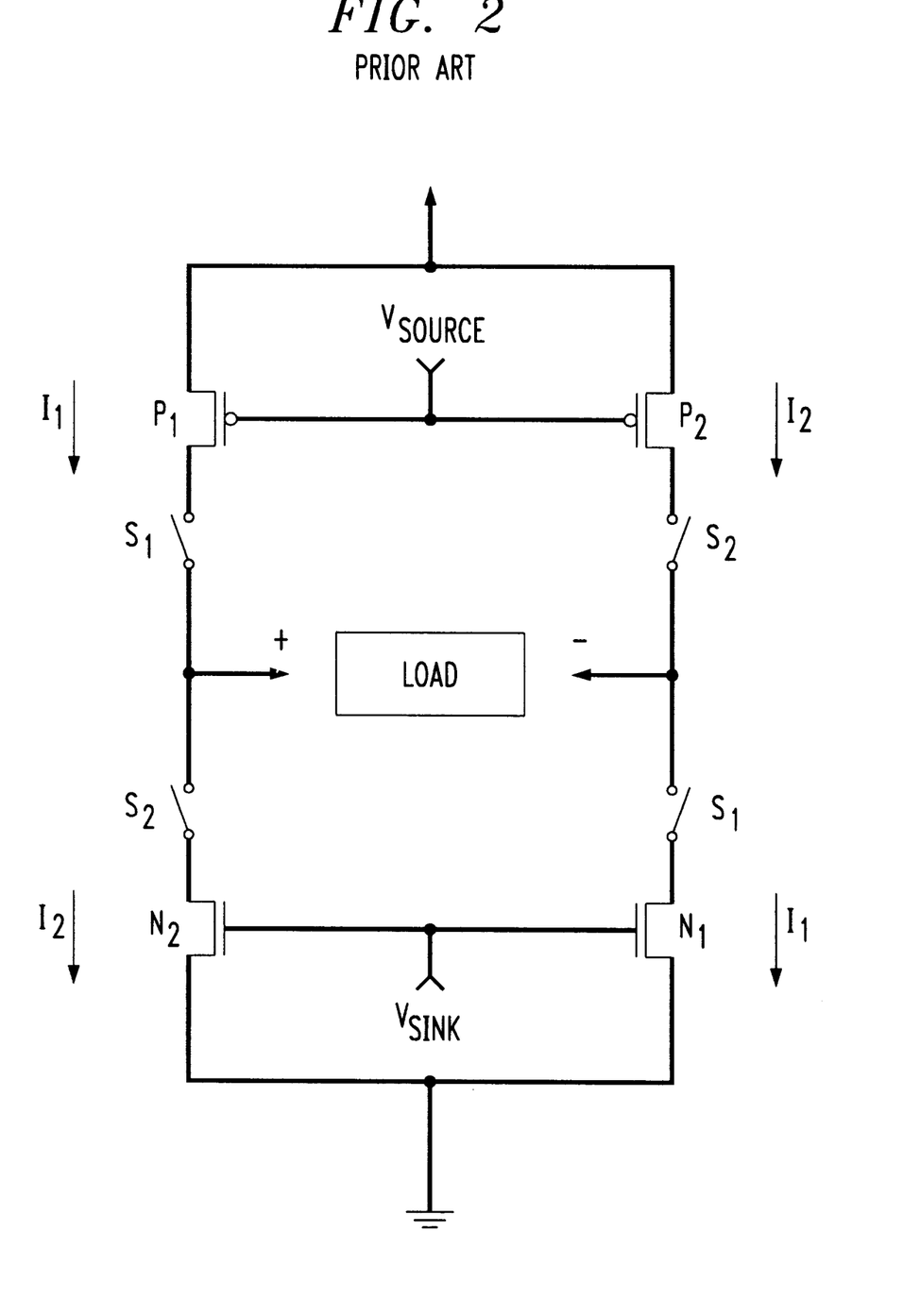
FIG. 2 is a schematic diagram of a conventional current steering output circuit having two current drivers to provide asymmetric output.

A conventional asymmetrical current steering output buffer is illustrated in FIG. 2. The circuit contains two independent current drivers, here shown as CMOS devices, which are turned on and off as the data state changes. In the first data state, current source and current sink transistors $P_1$ and $N_1$ are connected to the load by switches $S_1$ to thereby contribute a current of $I_1$ to the load. In the second data state, current source and current sink transistors $P_2$ and $N_2$ are connected to the load by switches $S_2$ to thereby contribute a current of $-I_2$ (i.e. a current of $I_2$ in the opposite direction of $I_1$) to the load.

These conventional circuits have several drawbacks. Principle among them is switching noise caused by turning the current flow in each current driver on and off as the data state changes. When two or more current sources are used (such as in FIG. 2), the gates of the current source transistors $P_1$ and $P_2$ are typically connected together and to a biasing voltage. This results in capacitive coupling between the devices during switching which temporarily effects the value of the bias reference voltage which, in turn, effects the magnitude of the output current. The switching noise and coupling effects not only upset the biasing and output levels of the switching buffer, but also the biasing of other buffers connected to the same reference voltages.

SUMMARY OF THE INVENTION

An output buffer circuit according to the present invention has a current driver supplying a current I which is connected to the first and second output nodes of the buffer by a current switch. The circuit also has a switchable shunt resistor connected to the current driver. The current supplied by the driver may be diverted through the switchable shunt resistor so that the current flow from the driver remains constant but does not contribute to the net load current. The current switch is configured so that in a first data state, the current supplied by the current driver flows from the first output node to the second output node to supply a current I to an attached load. In a second data state, the current flows from the second output node to the first output node to supply a current −I through the load. In a third data state, the current switch is configured to disconnect the current driver from the output nodes and the current from the current driver is diverted through the switchable shunt resistor so that no current is supplied to the load.

In a second embodiment, a plurality of current drivers is provided. Each current driver is connected to the load through a current switch and is also connected to a switchable shunt resistor as described above. In this configuration, each current driver may be selectively connected to the load to contribute a positive or negative current or the current may be diverted through its switchable shunt resistor so that no current is contributed to the load. This arrangement allows the net output current of the circuit to have a magnitude equal to the sum or difference of any or all of the currents supplied by each driver. By selecting current drivers that supply different magnitudes of current, an exponentially large number of different load currents may be defined. For example, a circuit with two current drivers which supply current of I and 2I, respectively, can supply a digitally variable load current having a magnitude of from −3I to 3I in increments of I while at all times maintaining a 3I current sourced and sunk from the current drivers.

In another embodiment of the invention, an output buffer has a first current driver supplying a first current and a second current driver supplying a second current. The first current driver is connected to the first and second output nodes of the buffer by a current switch. The current switch is configured so that in a first data state, the first current flows from the first output node to the second output node and in a second data state, the first current flows from the second output node to the first output node when a load is connected across the two output nodes.

The second current driver is connected to the output nodes by a switching arrangement so that in the first data state, the second current flows from the first output node to the second output node. In this state, full current (equal to the sum of the first and second currents) will flow from the first output node, through a connected external load, to the second output node. In the second data state, the second current driver is disconnected from the output nodes and the second current is diverted through a switchable shunt resistor. Thus, in the second data state, only partial current (e.g., the first current) will flow through an attached load, and it will flow in an opposite direction than it does in the first data state. The ratio of currents provided to the external load in the first and second data states can be controlled by adjusting the current output of the two current drivers.

In all configurations, the circuit may be formed of discrete components or integrated on an IC. If the circuit is integrated, the resistive element of the shunt resistor may be an active or passive resistance and can be integrated or be external to the chip. If an external resistor is used, the circuit can be fabricated with appropriate external connections so that the desired resistance can be attached by the user.

BRIEF DESCRIPTION OF THE DRAWINGS

The foregoing and other features of the present invention will be more readily apparent from the following detailed description and drawings of illustrative embodiments of the invention in which.

DETAILED DESCRIPTION OF THE PREFERRED EMBODIMENT

Figure 3:
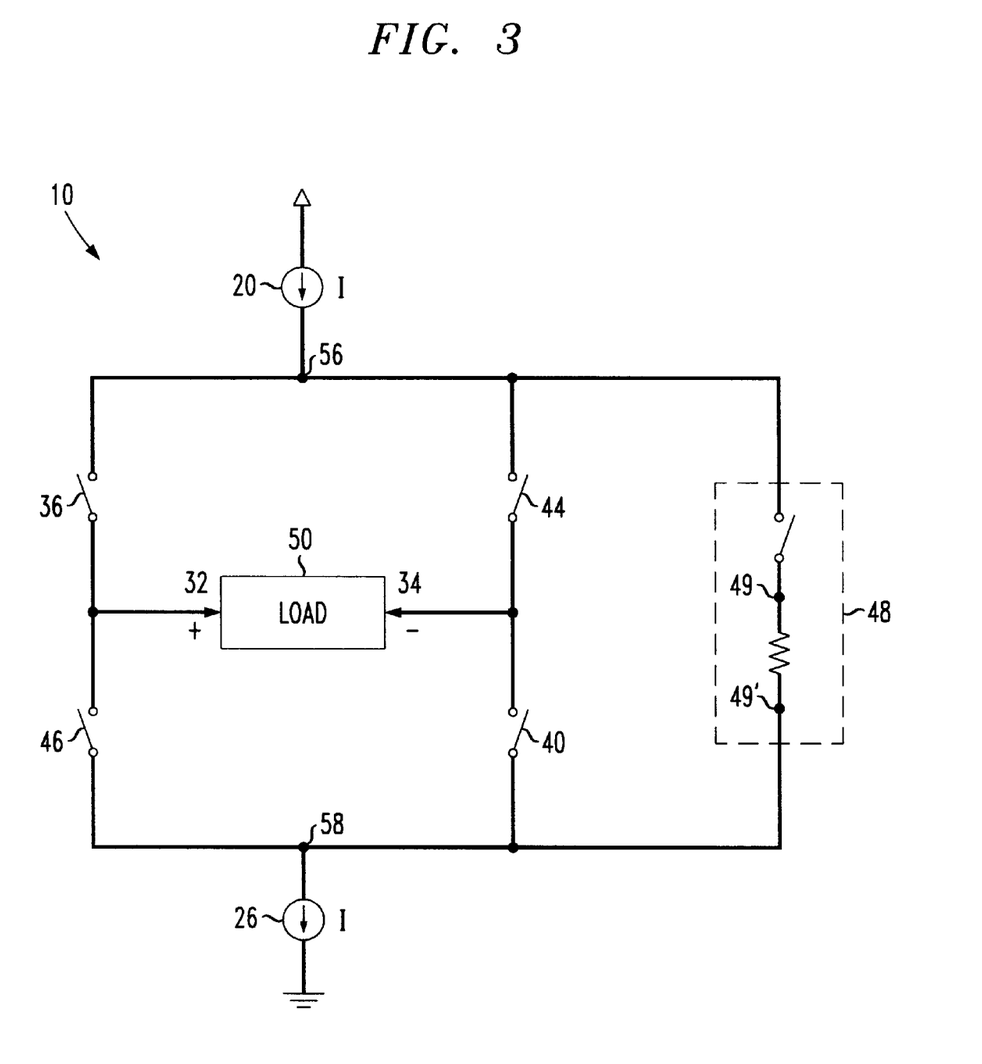
FIG. 3 is an ideal representation of a current steering output circuit according to the present invention.

FIG. 3 is an ideal representation of a current steering output circuit 10 according to the present invention having two output nodes 32 and 34 and a current driver comprised of current source 20 and current sink 26 configured to supply a current I. The current driver is connected to the first and second output nodes 32, 34 by a current switch so that the direction of current I through a load 50 attached to the output nodes 32, 34 may be selected according to the data state. In the preferred embodiment, the current switch is comprised of a first switching arrangement switchably connecting the current source 20 to both output nodes 32, 34 and a second switching arrangement switchably connecting the current sink 26 to both output nodes 32, 34. Preferably, the first switching arrangement is formed by a switch 36 for selectively connecting current source 20 to output node 32 and a switch 44 for selectively connecting current source 20 to output node 34 and the second switching arrangement is formed by a switch 40 for selectively connecting current sink 26 to output node 34 and a switch 46 for selectively connecting current sink 26 to output node 32. Other switching arrangements known to those skilled in the art may also be used.

Current source 20 is also connected to current sink 26 by a switchable shunt resistor 48 which may be switched from a non-conducting state to a resistive conducting state. The switchable shunt resistor 48 can be a passive resistor in series with a switch, an active resistor which may be enabled or disabled, or any other combination of elements which achieves the same result. In the preferred embodiments, switchable shunt resistor 48 is an active resistor with one or more switches connected in series.

The direction of current I through load 50 connected across the output nodes 32, 34 is selected by adjusting the state of switches 36, 40, 44, and 46. In a first data state, switches 36 and 40 are conducting and switches 44 and 46 are non-conducting. In this state, current I flows from output node 32 through the load 50 to node 34. In a second data state, switches 36 and 40 are non-conducting and switches 44 and 46 are conducting. In this state, current -I flows through the load 50 (i.e., a current I flows from output node 34 to node 32 through the load 50).

In a third data state, switches 36, 40, 44, and 46 are non-conducting and the switchable shunt resistor 48 is placed in the conducting state. In this state, the current I bypasses the load 50 and travels from node 56 to node 58 through the switchable shunt resistor 48 (defining a "shunt" current path). Thus, in the third data state, the circuit 10 supplies no current to the load. Preferably, the resistance of the switchable shunt resistor 48 is chosen so that the resistance between nodes 56 and 58 along the shunt current path is substantially equivalent to the expected resistance between nodes 56 and 58 when current is flowing through the load.

Those skilled in the art will recognize that the output circuit 10 may be integrated on a chip, formed of discrete components, or a combination of both. In particular, if the circuit is integrated, the resistive component of the switchable shunt resistor can be an external component connected to shunt nodes 49, 49' or can be formed on the chip by an accurate fabrication technique such as laser trimming or by active devices which are "tuned" by appropriate circuitry.

This configuration has several advantages over conventional asymmetric current steering output circuits. Unlike conventional asymmetric current output circuits, the current drivers in a circuit according to the present invention are not turned on and off from one data state to the next. Therefore, the internal node voltages are not affected by switching noise and there is no need to wait for the drivers to reach a steady state. Accordingly, switching can be done more quickly. Also, because the current flow from the drivers does not stop, but is simply diverted internally, the effect on the biasing voltages caused by capacitive coupling to internal nodes is greatly reduced.

Figure 4:
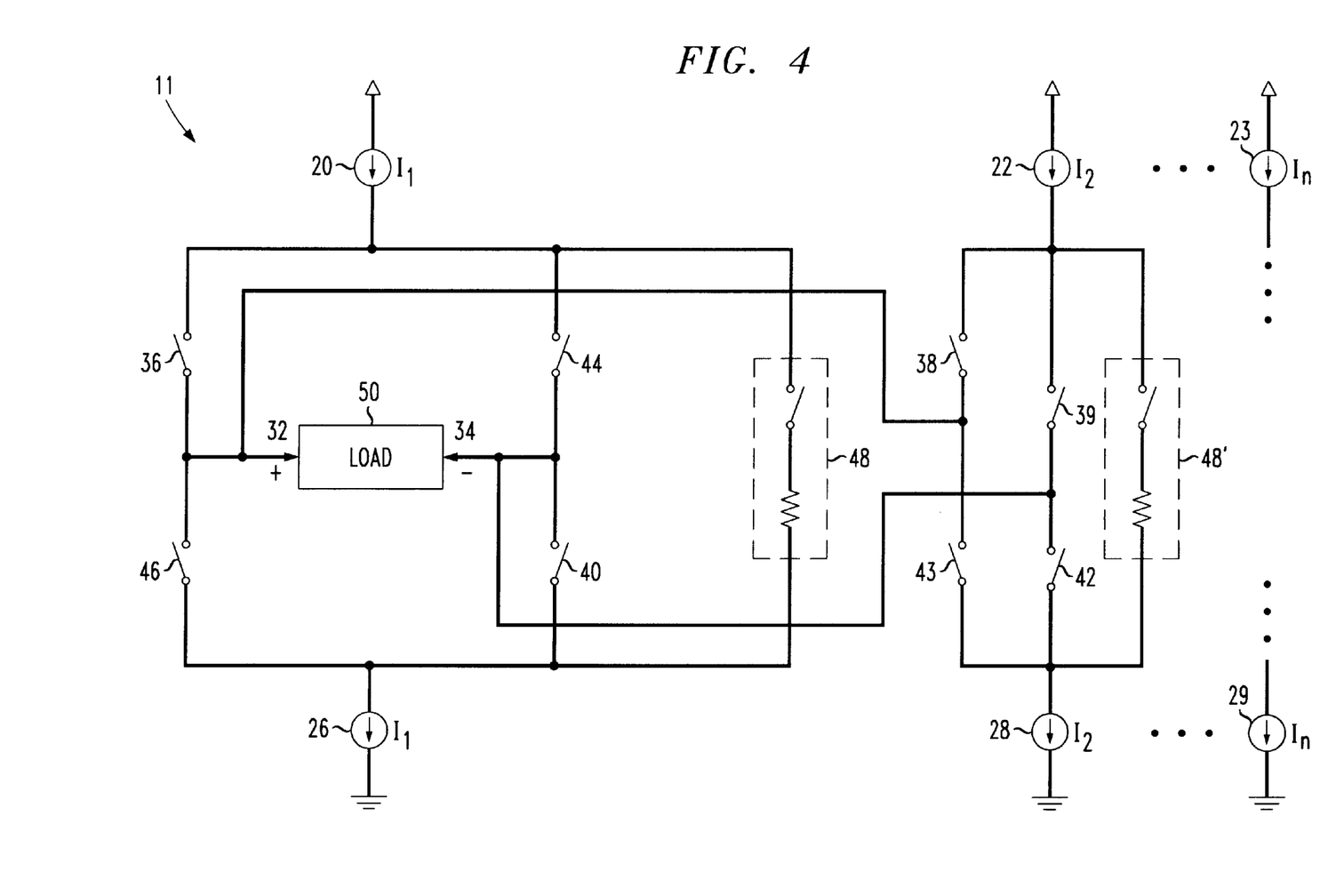
FIG. 4 is a current steering output circuit comprising a plurality of circuits as in FIG. 3.

FIG. 4 is a current steering output circuit 11 comprising a plurality of current steering output circuits 10 as in FIG. 3, each connected to the load 50. This configuration provides a variable or asymmetric output current. A first driver supplying a first current $I_1$ and comprising current source 20 and current sink 26 is connected to the load 50 by switches 36, 40, 44, and 46 and connected to switchable shunt resistor 48 as described above. A second current driver comprises current source 22 and current sink 28 and is configured to supply a second current $I_2$. The second current driver is connected to output nodes 32, 34 by a current switch comprising switches 38, 39, 42, and 43. A second switchable shunt resistor 48' is connected between current source 22 and current sink 28. Additional current drivers, illustrated as current source 23 and current sink 29 supplying a current $I_n$, may be similarly connected to the load 50.

This arrangement allows the net output current of the circuit to have a magnitude equal to the sum or difference of any or all of the currents supplied by each driver. By selecting current drivers that supply different magnitudes of current, an exponentially large number of different load currents may be defined. For example, if current $I_1$ has magnitude I and current $I_2$ has magnitude 2*I, the circuit 11 can supply an output current with magnitudes from -3I to +3I as shown in table below:

| FIRST CURRENT DRIVER | SECOND CURRENT DRIVER | OUTPUT LOAD CURRENT |
|---|---|---|
| $-I$ | $-2I$ | $-3I$ |
| shunt | $-2I$ | $-2I$ |

-continued

| FIRST CURRENT DRIVER | SECOND CURRENT DRIVER | OUTPUT LOAD CURRENT |
|---|---|---|
| $-I$ | shunt | $-I$ |
| shunt | shunt | 0 |
| $I$ | shunt | $I$ |
| shunt | $2I$ | $2I$ |
| $I$ | $2I$ | $3I$ |

Because the total current from each driver is always constant, the voltage drop across stray inductance in the circuit paths (i.e., bonding wires, package leads, etc.) is reduced to zero. In other words, $V=L * {di}/{dt}=0$, which in turn means that the circuit generates far less noise then a conventional circuit, as discussed above.

Figure 5:
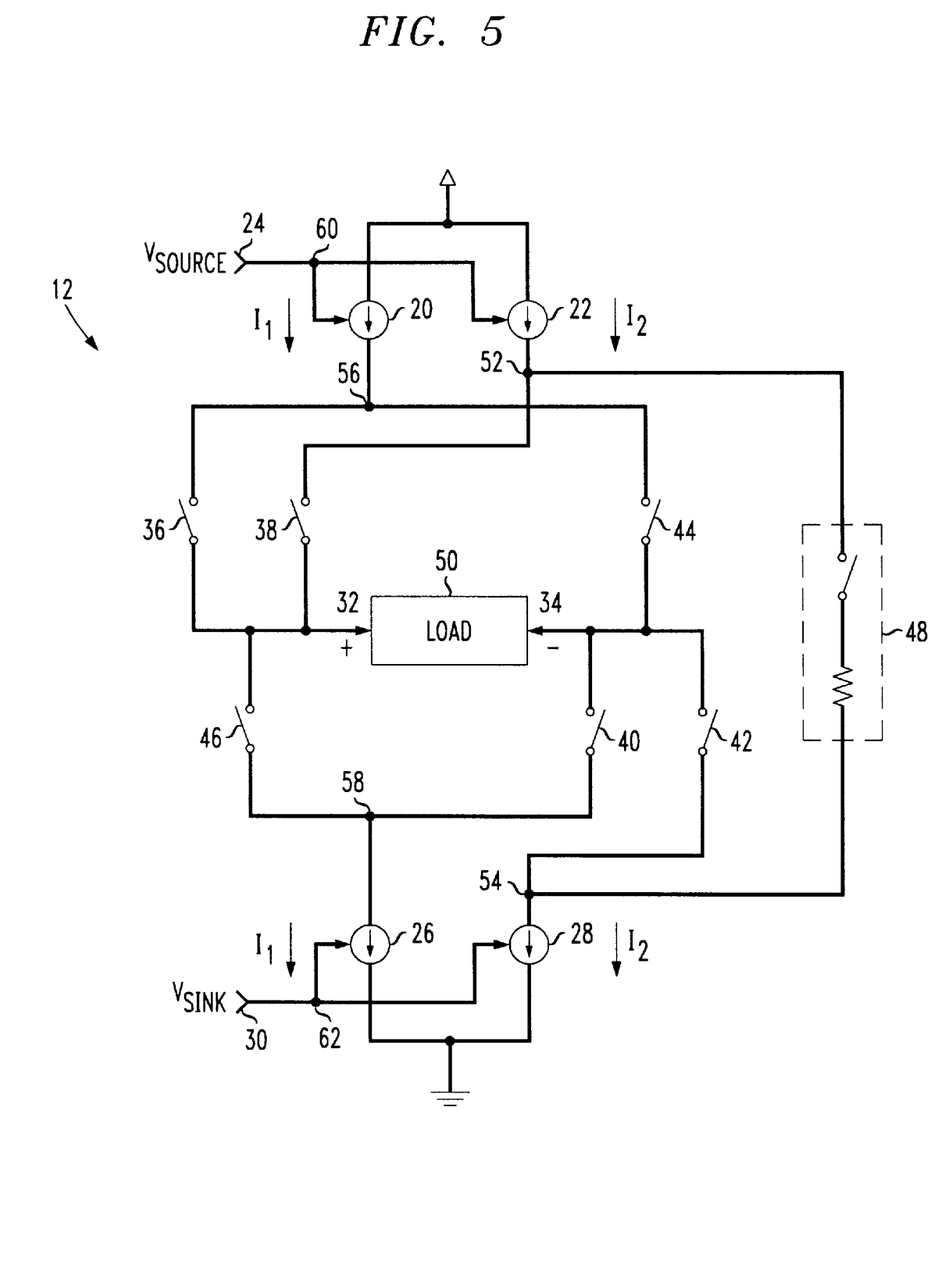
FIG. 5 is an ideal representation of an asymmetrical current steering differential output circuit according to a second embodiment of the present invention.

FIG. 5 is an ideal schematic diagram of an asymmetric current output circuit 12 according to a second embodiment of the present invention having two output nodes 32 and 34 and two current drivers. This embodiment is a modified version of the circuit of FIG. 4, discussed above. The first current driver is comprised of current source 20 and current sink 26 configured to supply a first current, $I_1$. The second current driver is comprised of current source 22 and current sink 28 and is configured to supply a second current, $I_2$. In a preferred embodiment, the current sources 20, 22 are controlled by a source bias voltage $V_{SOURCE}$ 24 and the current sinks 26, 28 are controlled by a sink bias voltage $V_{SINK}$ 30.

The first current driver is connected to the first and second output nodes 32, 34 by a current switch comprising switches 36, 40, 44, and 46 as discussed with respect to the embodiment of FIG. 3, above.

The direction of current $I_1$ through load 50 connected across the output nodes 32, 34 is determined by selecting the state of switches 36, 40, 44, and 46. In a first data state, switches 36 and 40 are conducting and switches 44 and 46 are non-conducting. In this state, current I1 will flow from node 32 through the load 50 to node 34. In a second data state, switches 36 and 40 are non-conducting and switches 44 and 46 are conducting. In this state, current $I_1$ will flow from node 34 through the load 50 to node 32. In this embodiment, current $I_1$ is always flowing through the load 50 and therefore no shunt path is required.

The second current source 22 is switchably connected to the first output node 32 by switch 38 and the second current sink 28 is switchably connected to the second output node 34 by switch 42. Current source 22 is also connected to current sink 28 by switchable shunt resistor 48.

In the first data state, switches 38 and 42 are conducting and the switchable shunt resistor 48 is non-conducting. In this state, current $I_2$ will flow from node 52 to node 54 through switch 38, load 50, and switch 42 (defining a "load" current path). Thus, the total current flowing through the load 50 in the first data state is $I_1+I_2$. In the second data state, switches 38 and 42 are non-conducting and the switchable shunt resistor 48 is placed in the conducting state. In this state, the current 12 bypasses the load 50 and travels from node 52 to node 54 through the switchable shunt resistor 48 (i.e., through the shunt current path). Thus, in the second data state, the total current flowing through load 50 is $-I_1$(i.e., a current $I_1$ flows from output node to node 32 through the load 50). Preferably, the resistance of the switchable shunt resistor 48 is chosen so that the resistance between nodes 52 and 54 along the shunt current path is substantially equivalent to the expected resistance between nodes 52 and 54 along the load current path.

The buffer 12 may also be "tri-stated" by placing all of the switches connected to nodes 32 and 34 in a non-conducting state. This effectively disconnects and isolates the buffer from an attached load. The switchable shunt resistor can also be set non-conducting to save power when the buffer 12 is tri-stated.

The ratio of output current between the first and second data states can be set by appropriately configuring the current drivers. For example, if the base load current is −2 mA and the desired output is a net current flow of +/−10 mA, current source 20 and current sink 26 should be configured to supply a current $I_1$=8 mA and current source 22 and current sink 28 should be configured to supply a current $I_2$=4 mA. In the first data state, the buffer 12 outputs a current of $I_1+I_2$ =12 mA across the load 50. Because of the −2 mA base current in the load, the net result is a load current of 10 mA. In the second data state, current $I_2$ is diverted through the switchable shunt resistor 48 and the buffer outputs a current of $-I_1$=−8 mA across the load 50 giving a net load current of −8 mA−2 mA=−10 mA.

Unlike conventional asymmetric current output buffers, the current drivers, comprised of current sources 20, 22 and current sinks 26, 28, are always on. Thus, the internal voltages at nodes 52, 54, 56 and 58 remain essentially constant because current is always flowing through the internal impedances of the current sources and sinks, creating a constant voltage drop. This stability is enhanced when the resistance between nodes 52 and 54 along the load and shunt current paths is the same, resulting in the same voltage drop from node 52 to node 54 in either data state, and thus the same operating point for current source 22 and current sink 28.

This stability means that switching can be done more quickly because no additional time is needed for the current drivers to reach the steady-state node voltages. Further, the stability of the internal node voltages reduces the effect of capacitive coupling between the internal nodes and the external nodes 60, 62 which can interfere with the source and sink reference voltages 24, 30. Lastly, since buffer 12 always presents a constant impedance to the power supplies, thereby always drawing a constant current, the ${di}/{dt}$ term caused by asymmetry in the circuit is reduced significantly compared to a conventional asymmetric driver, thus reducing the ground bounce level.

Figure 6:
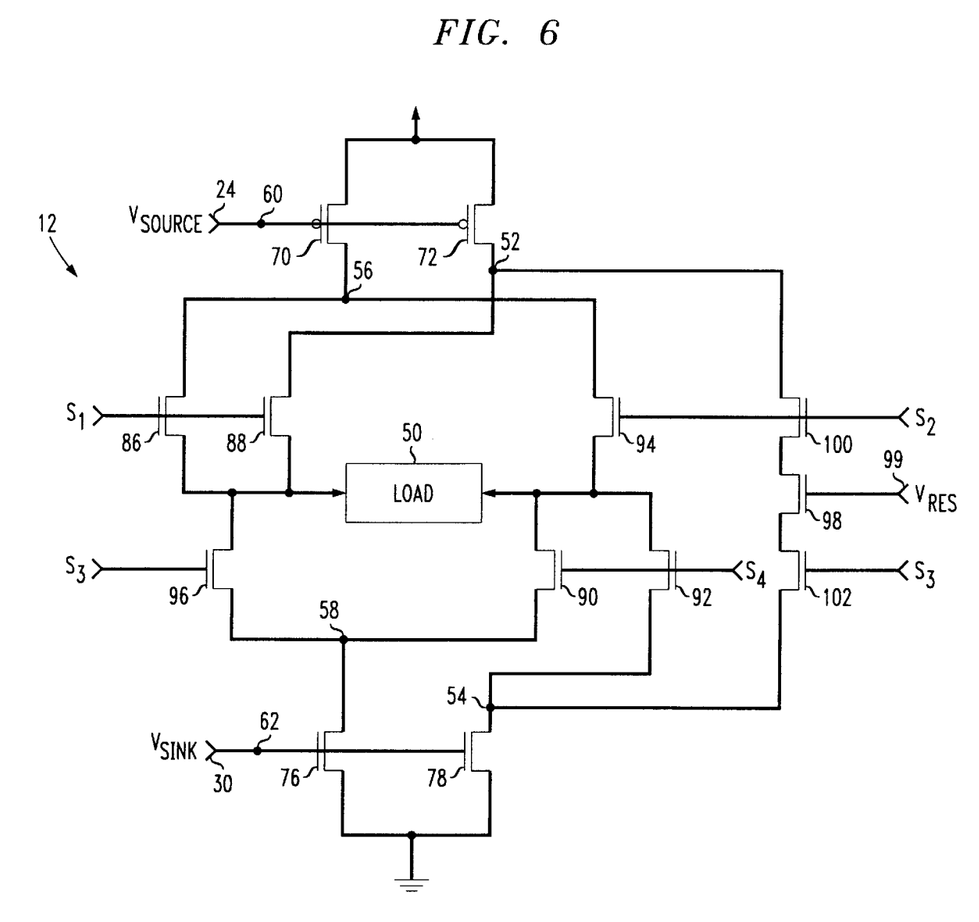
FIG. 6 is a schematic diagram of one embodiment of the output circuit of FIG. 5.

A preferred embodiment of this circuit is shown in FIG. 6. All of the circuit components are MOS transistors. However, other devices such as bipolar transistors may also be used. Preferably, the current drivers are CMOS devices. Current sources 20, 22 are implemented as p-channel transistors 70, 72. The gates of both transistors are tied together and driven to source biasing voltage $V_{SOURCE}$ 24. Since both transistors have the same bias voltage, the ratio between the sourced currents is determined by the device sizes. Current sinks 26, 28 are implemented as n-channel transistors 76, 78. As with the current sources, the gates of transistors 76, 78 are tied together and driven to sink biasing voltage $V_{SINK}$ 30. The size of the transistors should be chosen so that transistor 76 sinks the current sourced by transistor 70 and transistor 78 sinks the current sourced by transistor 72.

Switches 36, 38, 40, 42, 44, and 46 are implemented as transistors 86, 88, 90, 92, 94, and 96 respectively. The switched shunt resistor 48 is preferably implemented as a transistor 98 biased by a gate voltage $V_{RES}$ 99. $V_{RES}$ 99, the resistance reference voltage, preferably is a digital biasing signal. However, an analog reference voltage may also be used. The resistance of transistor 98 is determined by the geometry of the device in conjunction with the applied biasing voltage. Alternatively, the switchable shunt resistor 48 may be implemented as a passive, or non-switchable, resistor in series with an appropriate switching element as illustrated in FIG. 3. The resistor may be integrated with the circuit or, alternatively, the circuit may have contacts to which an external resistor can be attached.

Because switch transistors 88 and 92 have an inherent resistance, it is advantageous to include matching switch transistors 100, 102 in series with transistor 98 as shown in FIG. 6 to better match the resistance of the load path and the shunt path. If these additional transistors 100, 102 have similar geometries as transistors 88 and 92, they will introduce a similar inherent resistances as transistors 88 and 92. The shunt transistor 98 can then be designed to have a resistance equal to the expected resistance of the load 50.

The transistor switches 86, 88, 90, 92, 94, 96, 100, and 102 may be operated independently of each other or operated in groups. In a preferred arrangement, the switches are grouped into four sets of two and biased by switching signals $S_1$–$S_4$ which place the switches in a conducting state when active and a non-conducting state when not active. As shown in FIG. 6, the gates of transistors 86 and 88 are both biased by $S_1$, transistors 94 and 100 are biased by $S_2$, transistors 96 and 102 are biased by $S_3$, and transistors 90 and 92 are biased by $S_4$. In the first data state, $S_1$ and $S_4$ are active and $S_2$ and $S_3$ are inactive. In the second data state, $S_1$ and $S_4$ are inactive and $S_2$ and $S_3$ are active. The buffer 12 may be placed in a tri-state mode by setting the switching signals $S_1$–$S_4$ inactive.

We claim:

1. A current driver circuit having first and second output nodes, said circuit comprising:
   a current driver generating a current;
   a switching arrangement connecting said current driver to said first and second output nodes; and
   a switchable shunt resistance connected to said current driver and being switchable from a non-conductive state to a resistive conductive state; wherein
   in a first data state, said current driver is connected to said first and second output nodes by said switching arrangement and said switchable shunt resistance is in the non-conductive state so that said current will flow through a load connected across said output nodes; and
   in a second data state, said current driver is disconnected from said output nodes by said switching arrangement and said switchable shunt resistance is in said resistive conducting state, so that said current will flow through said switchable shunt resistance.

2. The circuit of claim 1, wherein said switching arrangement comprises a current switch whereby, in said first data state, the direction of said current through said load can be varied.

3. An integrated circuit comprising a current driver circuit as in claim 1.

4. The integrated circuit of claim 3, wherein said switchable shunt resistance comprises a resistive element and a switch.

5. The integrated circuit of claim 3, wherein said switchable shunt resistance comprises a MOS transistor.

6. A current steering output circuit having first and second output nodes, and a plurality of current driver circuits, each said current driver circuit comprising:
   a current driver generating a current;
   a switching arrangement connecting said current driver to said first and second output nodes; and
   a switchable shunt resistor connected across said current driver and being switchable from a non-conductive state to a resistive conductive state; wherein
   in a first data state, said current driver is connected to said first and second output nodes by said switching arrangement and said switchable shunt resistor is in the non-conductive state so that said current will flow through a load connected across said output nodes; and
   in a second data state, said current driver is disconnected from said output nodes by said switching arrangement and said switchable shunt resistor is in said resistive, conducting state, so that said current flows through said switchable shunt resistor.

7. An integrated circuit that includes a current driving circuit having first and second output nodes and first and second shunt nodes, said current driving circuit comprising:
   a current driver generating a current;
   a first switching arrangement connecting said current driver to said first and second output nodes; and
   a second switching arrangement connecting said current driver to said first and second shunt nodes; wherein
   in a first data state, said current driver is connected to said first and second output nodes by said first switching arrangement and disconnected from said first and second shunt nodes by said second switching arrangement so that said current will flow through a load connected across said output nodes; and
   in a second data state, said current driver is disconnected from said output nodes by said first switching arrangement and connected to said shunt nodes by said second switching arrangement so that said current will flow through a resistance connected across said shunt nodes.

8. The integrated circuit of claim 7, wherein said first switching arrangement comprises a current switch.

9. A current output circuit having first and second output nodes, said circuit comprising:
   a first current driver generating a first current;
   a current switch connecting said first current driver to said first and second output nodes, wherein in a first data state, said first current will flow from said first output node to said second output node when a load is connected to said output nodes and in a second data state, said first current will flow from said second output node to said first output node when said load is connected across said output nodes;
   a second current driver generating a second current;
   a switchable shunt resistance connected across said second current driver and being switchable from a non-conductive state to a resistive conductive state; and
   a switching assembly selectively connecting said second current driver to said first and second output nodes; wherein
   in the first data state, said second current driver is connected to said first and second output nodes by said switching assembly so that said second current will flow from said first output node to said second output node when said load is connected across said output nodes and said switchable shunt resistance is in the non-conductive state; and
   in the second data state, said second current driver is disconnected from said output nodes by said switching assembly and said switchable shunt resistance resistor is in a resistive conducting state, wherein said second current flows through said switchable shunt resistance resistor.

10. The current output circuit of claim 9, wherein:

said first current driver comprises a first current source and a first current sink;

said current switch comprises a first switching arrangement switchably connecting said first current source to one of said first output node and said second output node and a second switching arrangement switchably connecting said first current sink to the other one of said first output node and said second output node;

said second current driver comprises a second current source and a second current sink;

said switching assembly comprises a first switch connecting said second current source to said first output node and a second switch connecting said second current sink to said second output node; wherein in the first data state, said first current source is connected to said first output node, said first current sink is connected to said second output node, and said first and second switches are conducting; and in the second data state, said first current source is connected to said second output node, said first current sink is connected to said first output node, and said first and second switches are non-conducting.

11. The current output circuit of claim 10, further comprising a third switch connected between said second current source and said switchable shunt resistance and a fourth switch connected between said switchable shunt resistance and said second current sink.

12. The current output circuit of claim 10, wherein:

said first switching arrangement comprises a third switch connected between said first current source and said first output node and a fourth switch connected between said first current source and said second output node; and said second switching arrangement comprises a fifth switch connected between said first current sink and said first output node and a sixth switch connected between said first current sink and said second output node.

13. The current output circuit of claim 12, further comprising a seventh switch connected between said second current source and said switchable shunt resistance and an eighth switch connected between said switchable shunt resistance and said second current sink.

14. The current output circuit of claim 10, wherein:

said first current source comprises a first MOS transistor;

said second current source comprises a second MOS transistor; and said first and second MOS transistors have gate voltages equal to a source reference voltage.

15. The current output circuit of claim 14, wherein:

said first current sink comprises a third MOS transistor;

said second current sink comprises a fourth MOS transistor; and said third and fourth MOS transistors have gate voltages equal to a sink reference voltage.

16. The current output circuit of claim 15, wherein:

said first switching arrangement comprises a third switch connected between said first current source and said first output node and a fourth switch connected between said first current source and said second output node; and said second switching arrangement comprises a fifth switch connected between said first current sink and said first output node and a sixth switch connected between said first current sink and said second output node.

17. The current output circuit of claim 16, further comprising a seventh switch connected between said second current source and said switchable shunt resistance and an eighth switch connected between said switchable shunt resistance and said second current sink.

18. The current output circuit of claim 17, wherein said first through eighth switches each comprise a MOS transistor.

19. The current output circuit of claim 15, wherein said switchable shunt resistance comprises a MOS transistor biased by a resistance reference voltage.

20. An integrated circuit that includes an asymmetric current output circuit having first and second output nodes, said current output circuit comprising:

a first current source;

a first switch connected between said first current source and said first output node;

a second switch connected between said first current source and said second output node;

a first current sink;

a third switch connected between said first output node and said first current sink;

a fourth switch connected between said second output node and said first current sink;

a second current source;

a fifth switch connected between said second current source and said first output node;

a second current sink;

a sixth switch connected between said second output node and said second current sink; and a switchable shunt resistance connected between said second current source and said second current sink and which is either in a non-conductive state or in a resistive conductive state.

21. The integrated circuit of claim 20, wherein said switchable shunt resistance comprises:

a resistive element;

a seventh switch connected between said second current source and said resistive element; and an eighth switch connected between said resistive element and said second current sink.

22. The integrated circuit of claim 21, wherein said first through eighth switches comprise first through eighth MOS transistors respectively.

23. The integrated circuit of claim 22, wherein:

the gates of said first and fifth transistors are connected to a first switching signal;

the gates of said second and seventh transistors are connected to a second switching signal;

the gates of said third and eighth transistors are connected to a third switching signal; and the gates of said fourth and sixth transistors are connected to a fourth switching signal.

24. The integrated circuit of claim 23, wherein:

said first current source comprises a ninth MOS transistor;

said second current source comprises a tenth MOS transistor;

the gate of said ninth transistor is connected to the gate of said tenth transistor; and said connected current source gates are biased to a source reference voltage.

25. The integrated circuit of claim 24, wherein:

said first current sink comprises an eleventh MOS transistor;

said second current sink comprises a twelfth MOS transistor;

the gate of said eleventh transistor is connected to the gate of said twelfth transistor; and said connected current sink gates are biased to a sink reference voltage.

26. The integrated circuit of claim 25, wherein said resistive element comprises a thirteenth MOS transistor biased by a resistance reference voltage.

* * * * *